United States Patent [19]

Houston

[11] 4,385,310
[45] May 24, 1983

[54] STRUCTURED COPPER STRAIN BUFFER

[75] Inventor: Douglas E. Houston, Ballston Lake, N.Y.

[73] Assignee: General Electric Company, Schenectady, N.Y.

[21] Appl. No.: 944,372

[22] Filed: Sep. 21, 1978

Related U.S. Application Data

[63] Continuation-in-part of Ser. No. 889,100, Mar. 22, 1978, abandoned.

[51] Int. Cl.³ .................... H01L 23/48; H01L 29/46; H01L 29/62
[52] U.S. Cl. ........................... 357/68; 357/65; 357/67; 357/79; 357/81; 228/193; 228/243
[58] Field of Search ................... 357/65, 68, 17, 81, 357/67, 79; 228/181, 193, 249

[56] References Cited

U.S. PATENT DOCUMENTS

| | | | |
|---|---|---|---|
| 2,906,930 | 9/1959 | Raithel | 357/65 |
| 3,128,419 | 4/1964 | Waldkotter | 357/65 |
| 3,273,029 | 9/1966 | Ross | 357/68 |
| 3,295,089 | 12/1966 | Moore | 357/81 |
| 3,365,787 | 1/1968 | Forsberg et al. | 228/181 |
| 3,387,191 | 6/1968 | Fishman | 357/81 |
| 3,675,089 | 7/1972 | Hantusch et al. | 357/81 |
| 3,761,783 | 9/1973 | Kroger et al. | 357/81 |
| 3,787,958 | 1/1974 | Freedman | 228/193 |
| 3,871,014 | 3/1975 | King et al. | 357/65 |
| 4,067,104 | 1/1978 | Tracy | 357/17 |
| 4,089,456 | 5/1978 | Toppen et al. | 228/243 |
| 4,156,458 | 5/1979 | Chu et al. | 357/81 |

OTHER PUBLICATIONS

Bell Laboratories Record; Electrical Contact with Thermo-Compression Bonds; by Christensen, Apr. 1958, pp. 127-130.

Primary Examiner—Andrew J. James
Attorney, Agent, or Firm—Marvin Snyder; James C. Davis, Jr.

[57] ABSTRACT

A structured copper strain buffer, which is thermally and electrically conductive is provided for use with semiconductor electronic devices. A thermo-compression diffusion bond is used to attach a metallic foil to a structured copper disk to form the strain buffer. The individual strands of copper within the strain buffer are capable of independent movement. The structured copper strain buffer provides a means of attachment to a semiconductor device without causing a stress to be generated at the attached surface of the device as the device expands and contracts with temperature changes.

17 Claims, 8 Drawing Figures

STRUCTURED COPPER STRAIN BUFFER

STRUCTURED COPPER STRAIN BUFFER

This invention is a continuation-in-part of my copending application Ser. No. 889,100, filed Mar. 22, 1978, now abandoned.

BACKGROUND OF THE INVENTION

This invention relates to strain buffers, and more particularly to structured copper strain buffers for achieving electrical and thermal connection to a semiconductor device without generating a stress at the place of connection to the device.

DESCRIPTION OF THE PRIOR ART

Structured copper, as employed herein, is comprised of a bundle of straight filamentary strands of copper parallel to each other and closely packed together. The strands are of approximately equal length and generally form disks ranging from 0.1 cm. to 1 cm. in thickness.

Structured copper disks are by nature very fragile. The strands tend to separate and cause the disk to fall apart. Thus, a retaining ring around the structured copper is used to temporarily hold it together while it is being handled. In the prior art, structured copper was comprised of copper cable segments in order to increase its structural integrity. The strands of such structured copper disks had less tendency to separate and fall apart because they were twisted together; however, the disks had the corresponding disadvantage that the individual strands of copper were not free to move independently. Thus, the stress relieving capabilities of such structured copper were limited.

In the prior art, the ends of the strands of structured copper disks were soldered together on one or both sides of the disk to increase its structural integrity. However, such layer of solder degrades the thermal conduction properties of the structured copper. The stress relieving properties of the structured copper disk are also impaired if solder flows into any of the spaces between the closely packed strands of copper.

The present invention concerns a structured copper strain buffer which exhibits structural integrity while still maintaining substantial stress relieving capability and high thermal conductivity. It should be apparent to those skilled in the art that improved electronic performance is to be gained from a semiconductor device attached to such structured copper strain buffer by virtue of the increased heat removal capacity and surface stress relief provided by the strain buffer.

It is an object of this invention to provide a structured copper strain buffer employing straight strands of copper and exhibiting substantial structural integrity.

It is another object of this invention to provide a structured copper strain buffer with substantial stress relieving capability and high thermal conductivity.

These and other objects of the invention will become apparent to those skilled in the art upon consideration of the following description of the invention.

BRIEF SUMMARY OF THE INVENTION

The present invention is directed to increasing the structural integrity of structured copper strain buffers, that is, decreasing the susceptibility of the individual strands of structured copper to become separated and fall apart. In accordance with the invention, a metallic member with at least one relatively flat surface is attached to one side of a piece of structured copper by means of a thermo-compression diffusion bond between the two materials. A method and apparatus for forming such thermo-compression diffusion bond are fully described and claimed in my copending patent application, Ser. No. 927,344 (c.i.p. of Ser. No. 889,099, now abandoned) which is assigned to the instant assignee.

Briefly, in accordance with one preferred embodiment of the invention, a strain buffer comprises a metallic member with at least one relatively flat surface abuttingly joined to one side of a bundle of straight copper strands. A sheet or block of metal may comprise the metallic member. The metallic member and the bundle of copper strands are joined by a thermo-compression diffusion bond. The individual strands of structured copper in this structure are free to move, that is, free to expand and to contract with changes in temperature. The disclosed strain buffer has a substantial amount of structural integrity, so that it will not fall apart upon being subjected to normal handling.

In another embodiment of the invention, a strain buffer comprises a separate metallic member abuttingly joined to each side of a structured copper disk.

When attached to the surface of a semiconductor device, the disclosed structured copper strain buffer provides a good electrical and thermal connection to the device without causing a stress to be created at the attached surface of the device as it expands and contracts with temperature. The strain buffer has excellent thermal conduction properties such that it efficiently draws heat away from the attached semiconductor device.

DESCRIPTION OF THE PREFERRED EMBODIMENT

Figure 1:
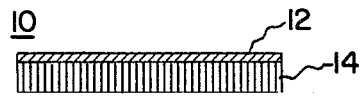
FIG. 1 is a side view of one embodiment of a structured copper strain buffer constructed in accordance with the present invention.

FIG. 1 illustrates one embodiment of the structured copper strain buffer of the invention, wherein strain buffer 10 is comprised of a metallic sheet 12 abuttingly joined to a structured copper disk 14. Copper, gold and other metals of appropriate characteristics may be used for metallic sheet 12. The thickness of metallic sheet 12 is typically in the range of ½ mil to 20 mils, that is, a thickness commensurate to that possessed by metal foils, and conveniently in the range of 1-3 mils. Thicknesses of metallic sheet 12 is somewhat smaller than ½ mil may be used providing the thickness is sufficient to provide structural integrity to structured copper disk 14 joined thereto. The thickness of metallic sheet 12 may also be larger than 20 mils, even so thick as to form a block of metal, providing this thickness is not so large as to substantially increase the thermal resistance of strain buffer 10.

Structured copper disk 14 is comprised of a bundle of straight filamentary strands of copper of approximately equal length. The strands of copper are closely packed together. Typically, the strands of copper are each 10 mils in diameter, although somewhat smaller or larger diameters are usable. Generally, best results are achieved when an aspect ratio (length to diameter of the copper strands) of 10 to 1 is used. Structured copper disks having a thickness ranging from 0.1 cm. to 1 cm. are typically used for disk 14 although disks of greater or smaller thickness may be used. Best strain relieving results are achieved when the copper strands are used with their natural oxide coating thereon. If cleaned strands of copper are used to form strain buffer 10, the strands tend to stick together and limit the buffer's stress relieving capability. Thus, the strands should be coated with a non-sticking substance such as copper oxide.

Figure 2:
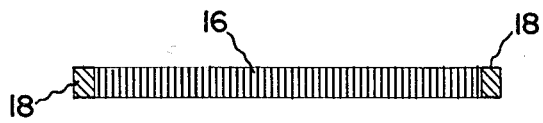
FIG. 2 is a side view of a structured copper disk encircled by a retaining ring.
Figure 3:
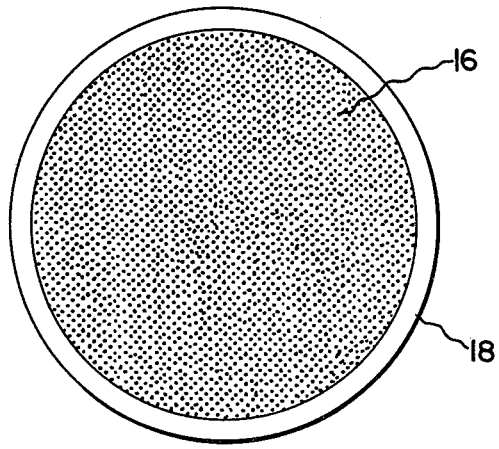
FIG. 3 is a top view of the structured copper disk of FIG. 2.

A structured copper disk, being formed of independent, freely moving strands of copper is at that time, an inherently a fragile object. Thus, as shown in FIG. 2, structured copper disk 16 is provided with a retaining ring 18 to hold the strands of copper together during handling and processing. FIG. 3 is a top view of structured copper disk 16 surrounded by retaining ring 18.

Figure 4:
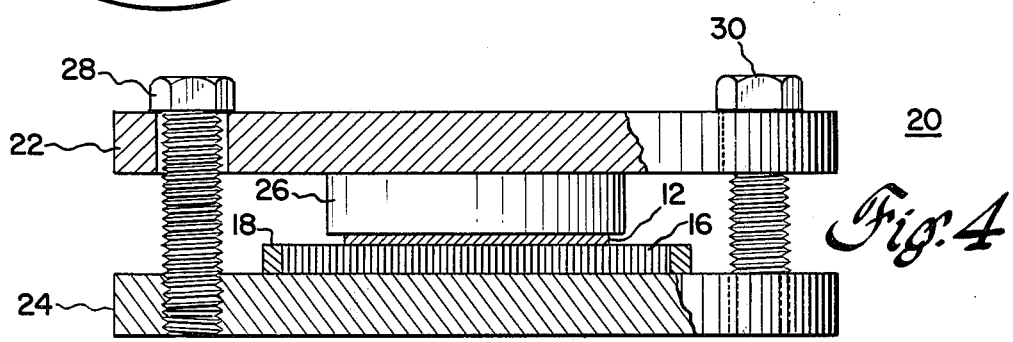
FIG. 4 is a side view of a thermo-compression diffusion bonding press which may be employed in fabricating the strain buffer of the present invention.

Referring again to structured copper strain buffer 10 of FIG. 1, metallic foil 12 and structured copper disk 14 are abuttingly joined together by thermo-compression diffusion bonding. Such bonding is readily performed in the diffusion bonding press described in my aforementioned copending application cited above Ser. No. 927,344, now abandoned. A diffusion bonding press 20 of this type is illustrated in FIG. 4. Upper metallic plate 22 is oriented parallel to lower metallic plate 24 with a space therebetween. Metallic pressing block 26 is positioned at the center of the side of upper plate 22 facing lower plate 24. Metallic bolts 28 and 30 pass through respective holes in upper plate 22 and lower plate 24 and are threaded into lower plate 24 to connect the two plates together as illustrated in FIG. 4.

Figure 5:
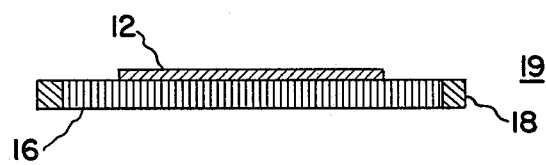
FIG. 5 is a side view of a structured copper disk with retaining ring, and metallic sheet attached to one side of the disk.

Metallic bolts 28 and 30 are comprised of a steel other than stainless steel, while upper plate 22, lower plate 24 and metallic pressing block 26 are comprised of stainless steel. To achieve the thermo-compression diffusion bond between structured copper disk 14 and metallic foil 12 to form strain buffer 10, it is necessary to position metallic foil 12 parallel to, and in contact with, structured copper disk 16 as shown in FIG. 5. This foil-disk assembly 19 is then placed between metallic pressing block 26 and lower plate 24 of press 20 as shown in FIG. 4. A conventional press is used to squeeze upper plate 22 and lower plate 24 together and while such pressure is applied to these plates, bolts 28 and 30 are tightened.

The thermo-compression diffusion bond between structured copper disk 16 and metal sheet 12 is actually formed when press 20 containing sheet-disk assembly 19 is placed in an inert atmosphere and heated to approximately 350° C. for approximately 15 minutes to 5 hours. When press 20 is so heated, upper plate 22, lower plate 24 and metallic pressing block 26 expand to a greater total extent than do metallic bolts 28 and 30. Thus, a force is exerted between pressing block 26 and lower plate 24 resulting in the squeezing of structured copper disk 16 and metallic foil 12 together and the bonding of each to the other. Sheet-disk assembly 19 is then removed from diffusion bonding press 20. Retaining ring 18 and any loose strands of structured copper outside the area of the diffusion bond are also removed from sheet-disk assembly 19. The remaining structure thus formed constitutes structured copper strain buffer 10.

Figure 6:
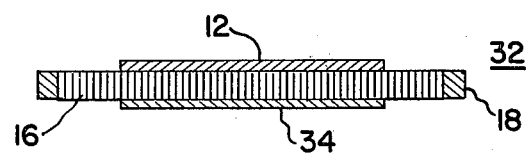
FIG. 6 is a side view of a structured copper disk with retaining ring, and separate metallic sheets attached to each side of the disk.
Figure 7:
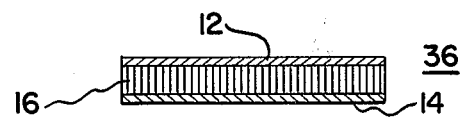
FIG. 7 is a side view of another embodiment of the structured copper strain buffer of the invention, wherein a separate metallic sheet is attached to each side thereof.

A strain buffer of additional structural integrity may be formed by thermo-compression diffusion bonding a metallic sheet to both sides of a structured copper disk. Such a sheet-disk assembly 32 is formed by positioning metallic sheets 12 and 34 on the opposite sides of structured copper disk 16 as shown in FIG. 6. Sheet-disk assembly 32 is then placed in diffusion bonding press 20 and processed as described above. A structured copper strain buffer 36 with metallic sheet on each side thereof, as shown in FIG. 7, is thus produced.

Figure 8:
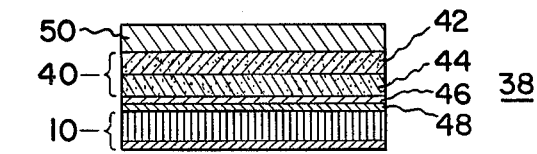
FIG. 8 is a side view of the structured copper strain buffer of FIG. 1 attached to a semiconductor device.

FIG. 8 illustrates a structured copper strain buffer 10 attached to a semiconductor device 40. For convenience, semiconductor device 40 is represented as a diode having a first electrode region 42 and a second electrode region 44, with electrode region 44 attached to buffer 10. However, other semiconductor devices such as transistors and thyristors may also be attached to structured copper strain buffers.

A tungsten back-up plate 50 is alloyed to (i.e. attached to) the surface of first electrode region 42 as shown in FIG. 8. Semiconductor device 40 comprised of silicon, for example, is a fragile structure. Tungsten back-up plate 50 provides semiconductor device 40 with structural strength. The thermal coefficient of expansion of tungsten is approximately the same as that of silicon such that the alloy formed at the interface of plate 50 and device 40 does not crack as device 40 expands and contracts with changes in temperature.

To attach a semiconductor device 40 to structured copper strain buffer 10, the surface of electrode region 44 is first coated with a metallization comprised of a first metallic layer 46 and a second metallic layer 48. First metallic layer 46 may be comprised of titanium and is deposited directly on the surface of electrode region 44. Second metallic layer 48 may be comprised of copper or gold. Strain buffer 10 is then brought into abutting contact with the metallized surface of electrode 44 to form device-buffer assembly 38. A thermo-compression diffusion bond is formed between the metallized surface of electrode 44 and strain buffer 10 by positioning the device-buffer assembly 38 between plate 24 and pressing block 26 of diffusion bonding press 20 shown in FIG. 5 and performing the previously described procedure for forming a diffusion bond. In one embodiment of the invention, a metallization with a first metallic layer 46 with a thickness of about 200 Å of titanium and a second metallic layer 48 with a thickness of about 10,000 Å of gold is applied on the surface of electrode region 44 to which strain buffer 10 is bonded. The bond is made at a temperature of approximately 325° C. in a nitrogen atmosphere.

Another embodiment of the invention is achieved when the metallization is comprised of a first layer 46 of titanium, a second layer 48 of silver and a third layer of gold.

Alternatively, strain buffer 10 need not be diffusion bonded to semiconductor device 40. The strain buffer 10 is placed in abutment with electrode 44 of semiconductor device 40 such that strain buffer 10 and device 40 bear against each other and form another embodiment of the invention.

As the operating temperature of semiconductor device 40 increases, the individual strands of structured copper strain buffer 10 are free to move in the plane of the structured copper disk as the device expands. Thus, the buffer provides a means of attachment to an electrode region which does not cause a thermally-induced stress to be present at the place of attachment. Strain buffer 10 provides a good electrical connection to electrode region 44 while also providing a good thermal path away from the device for heat generated at electrode region 44.

The foregoing describes a structured copper strain buffer employing straight strands of copper arranged in the form of a disk and attached to a metallic sheet by thermo-compression diffusion bonding. The buffer exhibits substantial structural integrity while still allowing individual movement of the separate strands of structured copper within the plane of the disk such that the buffer provides substantial stress relieving capability together with high thermal conductivity.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

What is claimed is:

1. A thermally and electrically conductive strain buffer for semiconductor devices comprising:
   a bundle of straight strands of copper, each of said strands being of substantially equal length and having a nonsticking coating thereon except at the ends of said strands, said strands being arranged substantially parallel with each other and closely packed together, one common end of said bundle of copper strands being adapted to be diffusion bonded to a semiconductor device; and
   a first metallic member including at least one relatively flat surface, said surface abuttingly joined to, and said member diffused into, the opposite common end of said bundle of copper strands, said first metallic member being adapted to be bonded to a heat removing structure so that said buffer can conduct heat efficiently away from said semiconductor device without causing thermally-induced strain at the interface of said strain buffer with said semiconductor device.

2. The strain buffer of claim 1 wherein said first metallic member is comprised of one of a group consisting of copper and gold.

3. The strain buffer of claims 1 or 2 wherein first said metallic member comprises a sheet.

4. The strain buffer of claims 1 or 2 wherein said first metallic member comprises a block.

5. The strain buffer of claim 3 wherein the thickness of said sheet is within the range of ½ mil to 20 mils.

6. The strain buffer of claim 3 wherein the thickness of said sheet is within the range of 1 mil to 3 mils.

7. The strain buffer of claim 1 wherein the length of said strands of copper is within the range of approximately 0.1 to 1 cm.

8. The strain buffer of claim 3 wherein the length of said strands of copper is within the range of approximately 0.1 to 1 cm.

9. The strain buffer of claim 5 wherein the length of said strands of copper is within the range of approximately 0.1 to 1 cm.

10. The strain buffer of claim 1, wherein a second metallic member is abuttingly joined to, and diffused into, the common end of said bundle of copper strands opposite said first metallic member.

11. An electronic device having a thermally and electrically conductive connection thereto, comprising:
    a bundle of straight strands of copper, each of said strands being of substantially equal length and having a nonsticking coating thereon except at the ends of said strands, said strands being arranged parallel with each other and closely packed together;
    a first metallic sheet abuttingly joined to, and said sheet diffused into, a common end of said bundle of copper strands, said first metallic sheet being adapted to be bonded to a heat removing structure; and
    a semiconductor device having a first electrode region in contact with, and operatively diffusion bonded to, the end of said bundle of copper strands opposite said common end, such that electric current is efficiently provided to said first electrode region while heat is efficiently conducted away from said first electrode region without causing thermally-induced strain at said first electrode region.

12. The electronic device of claim 11 wherein said semiconductor device includes a second electrode region.

13. The electronic device of claim 12 including a tungsten plate positioned in abutment with said second electrode region.

14. The electronic device of claim 11 wherein said first electrode region is bonded to the end of said bundle of copper strands opposite said common end.

15. The electronic device of claim 11 wherein the surface of said first electrode is coated with a metallization comprised of one of the group consisting of titanium-gold, titanium-silver-gold, or titanium-copper.

16. The electronic device of claim 11 wherein a second metallic sheet is abuttingly joined to, and diffused into, the end of said bundle of copper strands opposite said common end.

17. The electronic device of claim 15 wherein a second metallic sheet is abuttingly joined to, and diffused into, the end of said bundle of copper strands opposite to said common end.

* * * * *